United States Patent [19]
Anderson et al.
[11] 3,909,735
[45] Sept. 30, 1975

[54] SLOW SWITCH FOR BANDWIDTH CHANGE IN PHASE-LOCKED LOOP

[75] Inventors: Alfred T. Anderson, St. Petersburg; Robert S. Gordy, Largo; David E. Sanders, St. Petersburg, all of Fla.

[73] Assignee: NCR Corporation, Dayton, Ohio

[22] Filed: Apr. 4, 1974

[21] Appl. No.: 456,694

[52] U.S. Cl. ................ 329/122; 325/346; 325/419; 331/10; 331/23

[51] Int. Cl.[2] ........................ H03D 3/18; H03B 3/04

[58] Field of Search ...... 329/50, 122; 325/346, 419, 325/49; 331/10, 18, 23, 25

[56] References Cited

UNITED STATES PATENTS 3,447,084 5/1969 Haner et al. .......................... 325/49
3,729,688 4/1973 Cerny et al. ...................... 331/25 X
3,745,255 7/1973 Fletcher et al. ................. 325/419 X

*Primary Examiner*—Alfred L. Brody
*Attorney, Agent, or Firm*—J. T. Cavender; Albert L. Sessler, Jr.; Edward Dugas

[57] ABSTRACT

The invention is directed to a phase-locked loop circuit which utilizes a voltage controlled oscillator controlled by a pair of loop filters one of which passes a narrow range of frequencies and the other of which passes a wide range of frequencies. A variable impedance connects the outputs of the filters, with the output of the narrow loop filter connected to the input of the voltage controlled oscillator. Means are provided for controlling the variable impedance so as to smoothly switch control of the voltage controlled oscillator from the wide loop filter to the narrow loop filter for accurate and smooth phase locking.

8 Claims, 3 Drawing Figures

SLOW SWITCH FOR BANDWIDTH CHANGE IN PHASE-LOCKED LOOP

BACKGROUND OF THE INVENTION

When a phase-locked loop is used to recover a periodic signal in the presence of noise, the loop bandwidth chosen must often be a compromise between the bandwidth desired for fast acquisition (wide) and that desired for noise-free tracking (narrow). To avoid this compromise two bandwidths can be used. The wide bandwidth is used until the signal is acquired; then, after acquisition, the loop bandwidth is switched to narrow.

In U.S. Pat. No. 3,447,084, entitled, "Correction of Frequency Shift In Carrier Systems" by R. L. Haner et al., there is disclosed a circuit which utilizes a two bandwidth circuit. The circuit has two filters of differing bandwidth, which filters are switched into or out-of circuit by means of a relay. Connecting and disconnecting the filters in circuit by means of a relay has at least three significant disadvantages. The first disadvantage is that there is a voltage step difference which results from switching the input to the voltage controlled oscillator (VCO) between the outputs of the two filters. This voltage difference, which may be quite large, can come from a number of sources. Immediately after acquisition, the greatest contribution to this voltage difference is usually due to the slower response and greater noise attenuation of the narrow filter. However, the difference may also be due to other desired effects, such as designed gain difference in the filters, or to undesired effects such as unplanned gain differences and d.c. offsets. This step change in voltage which results from switching the VCO input between the outputs of the two filters can cause loss of lock. Switching is under control of a two-state lock indication signal, which signal has one state when the loop is out-of-lock and another state when it is in-lock.

The second disadvantage is the voltage transient which results from abrupt switching with real circuit devices, even when the voltage at the two filter outputs is equal. This transient can also cause the loop to lose lock.

The third disadvantage is that the ratio of wide to narrow filter bandwidth is limited if a frequency offset exists. With abrupt switching, the wide filter is used to bring the VCO to within the acquisition range of the narrow filter. After switching, the narrow loop acquires the signal. However, if the frequency offset due, for example, to noise and/or phase jitter at the time of switching is not within the acquisition range of the narrow filter, the loop will lose lock. The bandwidth of such a system must therefore be limited in order to limit the peak frequency offset before switching to that which can be accommodated after switching.

It therefore would be highly desirable if a dual bandwidth phase-locked circuit could be switched without incurring the above disadvantages.

SUMMARY OF THE INVENTION

In the present invention, smooth switching between two filters of a closed phase-locked loop is accomplished without loss of lock. In a preferred embodiment of the present invention a VCO is connected in a closed loop with a phase detector and a first low pass filter. A second low pass filter having a cutoff frequency greater than that of the first low pass filter is connected in parallel with the first low pass filter by a variable resistance. A resistance control means responsive to the in-lock state of a lock indicator controls the variable resistance so as to smoothly increase the resistance between the two filters outputs to effectively decrease the output of the second low pass filter as acquisition of the to-be-detected phase signal falls within the range of the first low pass filter. A lock indicator circuit in response to the VCO signal and the received signal provides a signal indicative of the presence or absence of phase lock.

In the out-of-lock condition the variable resistance is at its lowest range and the output of the wide filter is effectively connected to the output of the narrow filter through a low impedance drive. The narrow filter is therefore forced to follow the faster response time of the wide filter. This will also force the output voltage of the two filters to be equal. During switchover the VCO control line is effectively connected to a combination of the wide and narrow filter outputs which, as the variable resistance is increased, results in a gradual reduction of bandwidths from wide to narrow. As the resistance is increased, the wide filter has less effect on the narrow filter's response because it no longer appears as a low impedance source.

The gradual change forces the closed loop circuit to remain in lock at all times so that the ratio of wide to narrow bandwidth can be much higher than that which is used with conventional switched bandwidth circuits.

From the foregoing it can be seen that it is a primary object of the present invention to provide an improved bandwidth switching circuit for use in a closed loop circuit.

It is another object of the present invention to provide a circuit for controllably switching the bandwidth of a closed loop circuit in a smooth transition.

It is another object of the present invention to force a narrow filter to respond initially as fast as a wide filter when the filters are used in a phase-locked loop circuit.

It is a further object of the present invention to provide a circuit for switching the control of a phase-locked loop circuit between two closed loop paths.

These and other objects of the present invention will become more apparent and better understood when taken in conjunction with the following description and the accompanying drawings, throughout which like characters indicate like parts and which drawings form a part of this application.

DESCRIPTION OF THE PREFERRED EMBODIMENT

Figure 1:
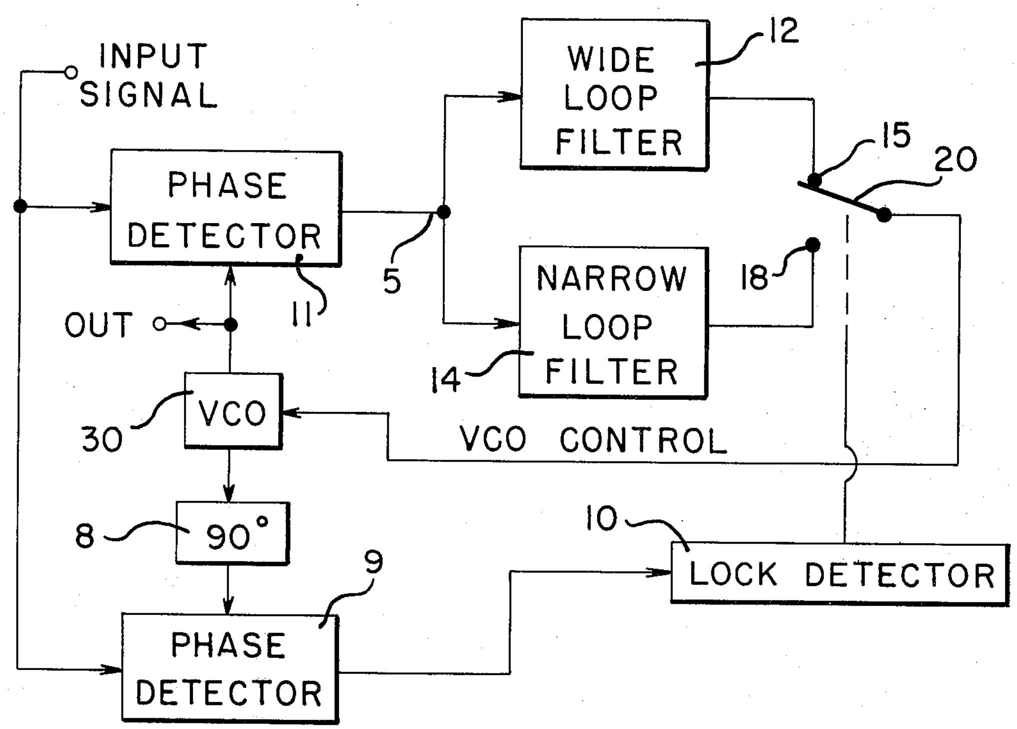
FIG. 1 PRIOR ART
FIG. 1 is a block diagram of a prior art phase-locked loop circuit.

In FIG. 1 there is described a prior art circuit with switchable bandwidth. The input is assumed to be a periodic or nearly periodic signal having a basic frequency component to which the loop can lock. It may also be modulated and/or corrupted with additional components such as noise and phase jitter. This input is fed to a phase detector 11. A voltage controlled oscillator 30 provides a local reference signal having a frequency which is variable over a range on either side of the nominal frequency of the component of the input signal to which the loop is to lock. The phase detector provides an output signal which is a function of the frequency and/or phase difference between the VCO signal and the input. The phase detector output signal 5 is fed to two low pass filters, one a wide loop filter 12 and the other a narrow loop filter 14. The cutoff frequency of the narrow loop filter is substantially lower than the cutoff frequency of the wide loop filter. Each of the filters operates so as to remove those signal components which have a frequency greater than their respective cutoff frequency. The output of filter 12 is fed to a switch terminal 15 with the ouput of filter 14 being fed to a switch terminal 18. A switch contact 20, under the control of a lock detection signal, connects terminal 15 to the input of the VCO 30 when the loop is out-of-lock, and connects terminal 18 to the VCO 30 when the loop is in-lock. The output of the VCO aside from being fed to the phase detector 11 is often the output of the phase-locked loop although in some cases the VCO control line or phase detector output may be the desired output from the loop. In operation the VCO provides an output signal the frequency of which is a function of the signal present at the switch contact 20. In a locked condition the frequency of the output signal from the VCO will be the same as the nominal frequency of the component of the received input signal to which the loop is locked.

Because the output signal from the phase detector is generally contaminated with noise, phase jitter, and frequency translation, the filters are used to remove a major portion of these undesired signals. The wide loop filter 12 is used, initially, to acquire the first locking of the loop to the input signal. The bandwidth of the wide loop filter is of such a width that initial lock-up is assured but because of this bandwidth the signal at the output of the wide loop filter is generally contaminated with more noise than will allow for accurate tracking or reliable lock; therefore, after initial acquisition the switch 20 is moved from terminal 15, to terminal 18, thereby removing the wide loop filter from the closed loop path and inserting the narrow loop filter. The narrow loop filter with its narrower bandwidth provides a cleaner signal for driving the VCO. Detection of lock may be accomplished by a number of well known techniques one of which utilizes the filtered output of a second phase detector. The second phase detector 9 is connected to receive as inputs the input signal which is fed to phase detector 11 and a 90° phase shifted signal from the VCO 30. The 90° phase shifter 8 provides the desired phase shift. The output signal from the second phase detector will contain a large amplitude d.c. component when the phase-locked loop is in lock and a relatively small amplitude d.c. signal when the phase-locked loop is not in lock. The output signal from the second phase detector is then fed to a lock detector circuit 10. The lock detector circuit may be comprised of a low pass filter for eliminating all signal components except for the d.c. component and a threshold detector the level of which is set to flip switch 20 to terminal 18 when the filtered d.c. component signal from the low pass filter is above a preselected level and to flip switch 20 to terminal 15 when the d.c. component is below the preselected level.

Figure 2:
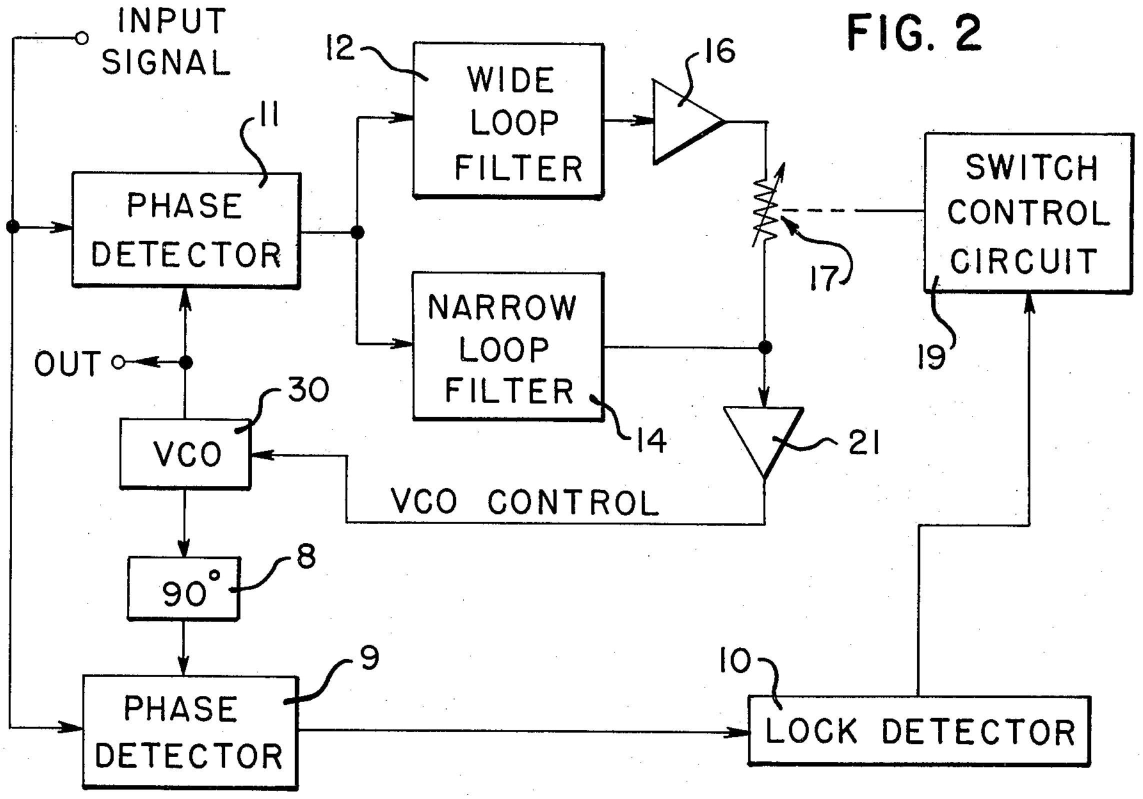
FIG. 2 is a block diagram of the preferred embodiment of the present invention.

Referring to FIG. 2, in order to eliminate the undesired effects of the prior art, applicants connect a low impedance drive amplifier 16 to the output of the wide loop filter 12 and connect a variable resistance 17, between the output of amplifier 16 and the output of the narrow loop filter 14. A switch control circuit 19 controllably varies the resistance of variable resistor 17 so as to gradually remove the signal contribution of the wide loop filter from the closed loop as acquisition of the detected signal falls within the range of the narrow loop filter. An amplifier 21 is connected to receive the output of the narrow loop filter 14 and any signal contribution which is made by the wide loop filter. Amplifier 21 in turn provides at its output the VCO control signal to the VCO 30. The switch control circuit receives as an input a lock detection signal from the lock detector 10 which signal is of one state when lock is detected and of another state at all other times. A number of prior art circuits can be used for this purpose, one of which is disclosed in connection with the FIG. 1 prior art circuit.

The circuit of FIG. 2 operates during initial acquisition by varying the resistance of variable resistor 17 to a minimum. This effectively connects the output of amplifier 16, and the output of the narrow loop filter 14, directly to the input of amplifier 21. The low impedance at the output of amplifier 16 forces the narrow filter output to follow the fast response of the wide loop filter which effectively gives the narrow filter a fast response time by forcing the voltages at the output of amplifier 16 and the filter 14 to be equal. After initial lock-up the variable resistance 17 is increased under the control of switch control circuit 19, to diminish the component contribution of the signal from amplifier 16 to the signal sent to the input of amplifier 21. This also reduces the effect of amplifier 16 on filter 14. With the resistance of the variable resistor 17 set at a maximum the closed loop system will be completely under the control of the narrow loop filter, and the response of the narrow loop filter is no longer influenced by the wide loop filter. During the slow transitions from a minimum resistance to a maximum resistance there exist no transient voltages or quick shifts in d.c. levels, therefore phase lock is smoothly achieved.

Figure 3:
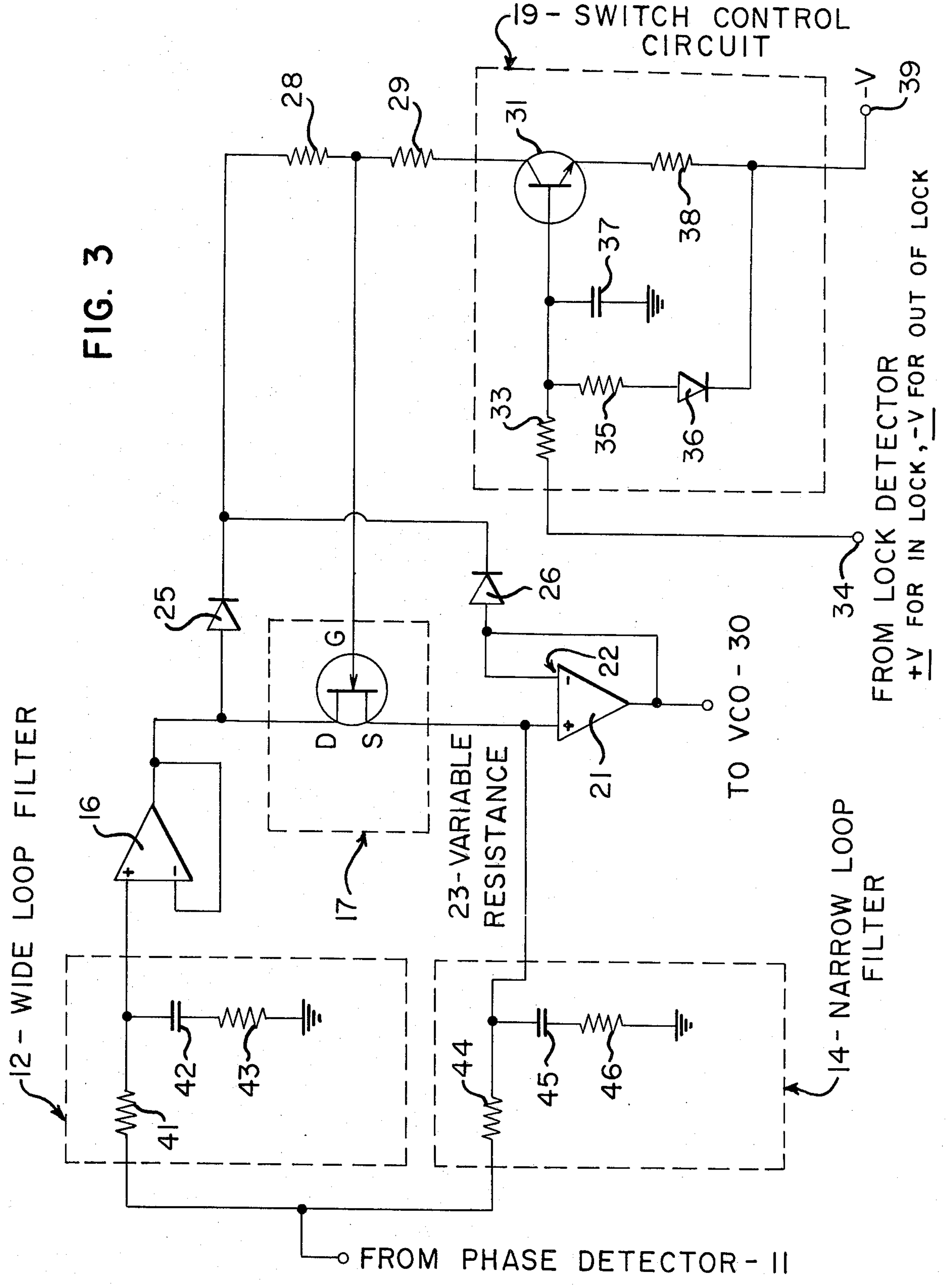
FIG. 3 is a schematic diagram illustrating in further detail a portion of the block diagram shown in FIG. 2; in particular, blocks 12, 14, 16, 17, 19 and 21 of FIG. 2 are implemented in the schematic diagram of FIG. 3.

In FIG. 3 a circuit for accomplishing the above is shown. FIG. 3 shows only the filters and switching portions of the complete loop of FIG. 2. The output signal from the phase detector 11 is shown fed both to the wide loop filter 12 and to the narrow loop filter 14. The wide loop filter is a low band pass filter comprised of resistor 41, in its first leg, and a capacitor 42 and a resistor 43, connected in series, in its second leg. Filter 14 is comprised of a resistor 44 in its first leg, and a capacitor 45 connected to a resistor 46, in its second leg. The cutoff frequency of the wide loop filter is substantially greater than the cutoff frequency of the narrow loop filter. The juncture of resistor 41 and capacitor 42 is connected to the input of the low impedance amplifier 16. The output of amplifier 16 is connected to the anode of a diode 25 and to the drain terminal of an N-channel junction FET transistor 23. Transistor 23 is used to provide the variable resistance 17. The source terminal of transistor 23 is connected to one input of a differential amplifier 21. The same terminal of the differential amplifier is connected to the junction point of resistor 44 and capacitor 45. The other input terminal 22 of differential amplifier 21 is connected to the anode of a diode 26 and to the output of amplifier 21. The cathodes of diodes 25 and 26 are connected together, and in turn are connected to a resistor 28. The voltage at the juncture of the other end of resistor 28 and a resistor 29 controls the gate of the FET 23. The switch control circuit 19 is shown comprised of an NPN transistor 31, the emitter of which is connected to a negative voltage source at terminal 39 by means of a resistor 38, and the base of which is connected by a resistor 33 to a terminal 34. The terminal 34 is connected to a lock detector circuit (not shown) for receiving a lock detection signal. The lock detection signal is of a positive voltage level whenever the system is in-lock and of a negative voltage level for all other conditions. The base of transistor 31 is also connected by means of a resistor 35 and a diode 36 to the negative voltage source at terminal 39. Additionally a capacitor 37 is connected between the base of transistor 31 and ground. The collector of transistor 31 is connected by means of resistor 29 and resistor 28 to the cathodes of diodes 25 and 26.

During initial acquisition, when the lock detector input is at −V, no current flows in transistor 31 and transistor 23 is thus closed providing a low resistance. The capacitor 45 in the narrow loop filter 14 is thereby forced to follow capacitor 42 in the wide loop filter 12 and charge to approximately the same level as capacitor 42. When lock is detected and indicated at terminal 34 by the presence of a +V signal, capacitor 37 begins to charge. The parallel resistance of resistors 33 and 35 in combination with the capacitor 37 causes the current in transistor 31, which was initially zero, to increase at an exponential rate in response to the lock signal change. Transistor 31 is a current source which is unaffected by the filter outputs or changes in the variable resistance 17. The current through transistor 31 will flow through resistor 28 and either diode 25 or 26 depending on which side of transistor 23 is more negative in voltage. This allows the voltage on the gate of transistor 23 to follow the more negative voltage on the drain or the source. Noise at the drain and source will have no effect on the resistance of transistor 23 since the resistance of this type of FET is determined by the voltage on the gate in relation to the voltage on the drain or source, whichever is more negative. The diode 26 is connected to the output of amplifier 21 rather than to the source terminal of transistor 23 so as to prevent the current which flows through diode 26 from loading transistor 23. Because capacitor 37 charges at an exponential rate, the current through transistor 31 does not change abruptly but follows the charge rate of the capacitor. The resistance between the drain and source of transistor 23 therefore follows the current through transistor 31 and changes smoothly as a function of that current. When initial acquisition is instituted or when lock is lost, the voltage at terminal 34 switches to a −V and transistor 31 is turned off. The resistance between the source and drain of transistor 23 then increases to its maximum valve. Other types of variable resistance devices may be substituted for the junction FET transistor 23; for example, a photosensitive device whose resistance varies as a function of incident light may be used in place of transistor 23 with the voltage present at the collector of transistor 31 controlling the intensity of a light source. Likewise other switching curves may be implemented by changing the filter consisting of Resistors 33, 35 and capacitor 37.

While there has been shown what is considered to be the preferred embodiment of the invention, it will be manifest that many changes and modifications can be made therein without departing from the essential spirit of the invention. It is intended, therefore, in the annexed claims to cover all such changes and modifications as may fall within the spirit and scope of the invention.

What is claimed is:

1. A phase-locked loop for recovering a periodic signal from a received signal in the presence of noise and other undesired signal components comprising in combination:

a phase detector having an input for receiving said received signal;

a variable frequency oscillator for providing a variable frequency signal to an input of said phase detector, the frequency of said variable frequency signal being determined by a control signal;

a narrow loop filter for cutting off signals having a frequency above a first value connecting the output of said phase detector to the input of said variable frequency oscillator at all times;

a wide loop filter for cutting off signals having a frequency above a second value, with said second value being substantially greater than said first value, said wide loop filter connected to receive the output of said phase detector;

variable impedance means connected between the output of said narrow loop filter and the output of said wide loop filter; and control means for increasing or decreasing the impedance of said variable impedance means at a controlled rate so as to smoothly shift emphasis of control of the variable frequency oscillator from the wide loop filter to the narrow loop filter for accurate and smooth phase locking.

2. The phase-locked loop of claim 1 wherein said control means is comprised of:

a current source connected to said variable impedance for changing the impedance of said variable impedance as a function of current; and a charging circuit connected in circuit with said current source, said charging circuit being activated when the phase-locked loop is within the acquisition range of said narrow loop filter for causing the current flow in said current source to increase smoothly.

3. The phase-locked loop of claim 2 wherein said variable impedance means is a field effect transistor the gate of which is connected in circuit to said current source, the drain of which is connected in circuit to the output of said wide loop filter, the source of which is connected in circuit to the output of said narrow loop filter and the resistance of which is a function of the voltage applied to said gate.

4. The phase-locked loop of claim 3 also including a pair of diodes for connecting the drain and the source, respectively, of said field effect transistor to said current source.

5. A phase-locked loop for recovering a periodic signal from a received signal in the presence of noise and other undesired signal components comprising in combination:

a phase detector having an input for receiving said received signal;

a variable frequency oscillator for providing a variable frequency signal to an input of said phase detector, the frequency of said variable frequency signal being determined by a control signal;

a narrow loop filter for cutting off signals having a frequency above a first value connected to receive the output of said phase detector;

a first amplifier connecting the output of said narrow loop filter to the input of said variable frequency oscillator at all times;

a wide loop filter for cutting off signals having a frequency above a second value, with said second value being substantially greater than said first value, said wide loop filter connected to receive the output of said phase detector;

a second amplifier connected to receive the output of said wide loop filter;

a variable impedance means connected between the output of said second amplifier and the output of said narrow loop filter; and a control means for increasing or decreasing the impedance of said variable impedance means at a controlled rate so as to smoothly shift emphasis of control of the variable frequency oscillator from the wide loop filter to the narrow loop filter for accurate and smooth phase locking.

6. A phase-locked loop for recovering a periodic signal from a received signal in the presence of noise and other undesired signal components comprising in combination:

a phase detector having an input for receiving said received signal;

a variable frequency oscillator for providing a variable frequency signal to an input of said phase detector, the frequency of said variable frequency signal being determined by a control signal;

a narrow loop filter for cutting off signals having a frequency above a first valve connected to receive the output of said phase detector;

a wide loop filter for cutting off signals having a frequency above a second value, with said second value being substantially greater than said first value, said wide loop filter connected to receive the output of said phase detector;

a first amplifier connecting the output of said narrow loop filter to the input of said variable frequency oscillator at all times;

a second amplifier connected to receive the output of said wide loop filter;

a current source;

a charging circuit connected in circuit with said current source, said charging circuit being activated when the phase-locked loop is within acquisition range of said narrow loop filter for causing the current flow in said current source to increase; and a field effect transistor the gate of which is connected in circuit to said current source, the drain of which is connected to the output of said second amplifier, the source of which is connected to the output of the narrow loop filter, and the resistance of which is a function of the voltage applied to said gate.

7. The phase-locked loop of claim 6 also including a pair of diodes for connecting the drain and source, respectively, of said field effect transistor to said current source.

8. Apparatus for recovering a desired signal component from a received signal containing undesired signal components, comprising:

a phase detector having a first input for receiving said signal;

a variable frequency oscillator for providing a second input signal to said phase detector, the frequency of said second input signal being determined by a control signal applied to a control input of said oscillator;

a first filter means having a first frequency response coupling the ouput of said phase detector to said control input of said oscillator at all times;

a second filter means having a second frequency response and also connected to receive the output of said phase detector;

variable impedance means coupled between the outputs of said first and second filter means; and means for varying the value of said impedance means to effectively shift emphasis of control of said oscillator from one of said filter means to the other.

* * * * *